(12) United States Patent
Wilkins et al.

(10) Patent No.: US 12,712,564 B2
(45) Date of Patent: Aug. 18, 2026

(54) DIGITAL-TO-ANALOG CONVERTER (DAC) WITH DAC ELEMENT ERROR MATCHING

(71) Applicant: Analog Devices, Inc., Wilmington, MA (US)

(72) Inventors: Paul S. Wilkins, Weston, MA (US); Enrique Alvarez-Fontecilla, Encinitas, CA (US)

(73) Assignee: Analog Devices, Inc., Wilmington, MA (US)

(*) Notice: Subject to any disclaimer, the term of this patent is extended or adjusted under 35 U.S.C. 154(b) by 125 days.

(21) Appl. No.: 18/664,774

(22) Filed: May 15, 2024

(65) Prior Publication Data

US 2025/0357945 A1 Nov. 20, 2025

(51) Int. Cl.
*H03M 1/66* (2006.01)
*H03M 1/08* (2006.01)

(52) U.S. Cl.
CPC ............. *H03M 1/662* (2013.01); *H03M 1/08* (2013.01)

(58) Field of Classification Search
CPC ........ H03M 1/74; H03M 3/502; H03M 3/464; H03M 1/0665; H03M 1/0668; H03M 1/66; H03M 1/067; H03M 1/0673; H03M 1/066; H03M 1/747; H03M 1/0604; H03M 1/08; H03M 1/662; H03M 1/687; H03M 3/338; H03M 3/424; H03M 7/165; H03M 1/00; H03M 1/06; H03M 1/0617; H03M 1/0626; H03M 1/0639; H03M 1/0641;

(Continued)

(56) References Cited

U.S. PATENT DOCUMENTS

| | | | |
|---|---|---|---|
| 5,138,317 | A | 8/1992 | Story |
| 5,404,142 | A | 4/1995 | Adams et al. |

(Continued)

FOREIGN PATENT DOCUMENTS

| | | |
|---|---|---|
| WO | 2010149182 | 12/2010 |
| WO | 2024158691 | 8/2024 |

OTHER PUBLICATIONS

"U.S. Appl. No. 18/102,504, Examiner Interview Summary mailed Mar. 19, 2025", 2 pgs.

(Continued)

*Primary Examiner* — Linh V Nguyen
(74) *Attorney, Agent, or Firm* — Schwegman Lundberg & Woessner, P.A.

(57) ABSTRACT

An example digital-to-analog converter (DAC) circuit may comprise a plurality of single-bit DAC elements, an encoder circuit, and a multiplexer circuit. The encoder circuit may be configured to generate a control signal, where a number of asserted bits in the control signal is based at least in part on a digital input signal and an asserted bit pattern of the control signal is based at least in part on a random signal. The multiplexer circuit may be configured to modify the control signal to generate a noise-corrected control signal having a noise-corrected bit pattern. The noise-corrected bit pattern may direct a first asserted bit of the noise-corrected control signal to activate a first single-bit DAC element and a second asserted bit of the noise-corrected control signal to activate a second single-bit DAC element, where the first single-bit DAC element and the second single-bit DAC element having respective errors that at least partially cancel.

20 Claims, 11 Drawing Sheets

(58) Field of Classification Search
CPC ............. H03M 1/0663; H03M 1/0836; H03M 1/0863; H03M 1/10; H03M 1/109; H03M 1/368; H03M 1/68; H03M 1/682; H03M 1/72; H03M 1/742; H03M 3/30; H03M 3/326; H03M 3/346; H03M 3/422; H03M 3/434; H03M 3/438; H03M 3/456; H03M 3/458; H03M 7/02; H03M 7/12; H03M 7/14; H03M 7/22; H03M 7/3015; H03M 7/3026
USPC .......................................... 341/118–121, 144
See application file for complete search history.

(56) References Cited

U.S. PATENT DOCUMENTS

| | | | | |
|---|---|---|---|---|
| 6,344,812 | B1 * | 2/2002 | Takeda | H03M 1/0663 341/143 |
| 6,466,147 | B1 * | 10/2002 | Jensen | H03M 1/0673 341/143 |
| 6,583,742 | B1 * | 6/2003 | Hossack | H03M 3/502 341/143 |
| 6,697,004 | B1 * | 2/2004 | Galton | H03M 1/066 341/143 |
| 6,762,702 | B2 | 7/2004 | Kwan | |
| 6,864,819 | B2 | 3/2005 | Wang | |
| 8,022,850 | B2 * | 9/2011 | Newman | H03M 1/0665 341/143 |
| 9,124,287 | B1 * | 9/2015 | Ho | H03M 1/109 |
| 9,337,854 | B1 * | 5/2016 | Chen | H03M 1/0673 |
| 9,384,370 | B1 * | 7/2016 | Choi | H03M 1/0673 |
| 9,735,799 | B1 * | 8/2017 | Nguyen | H03M 1/06 |
| 9,742,421 | B2 * | 8/2017 | Zhu | H03M 1/08 |
| 9,966,969 | B1 * | 5/2018 | Engel | H03M 1/662 |
| 12,438,549 | B2 | 10/2025 | Alvarez Fontecilla et al. | |
| 2002/0063647 | A1 * | 5/2002 | Brooks | H03M 1/067 341/118 |
| 2003/0197633 | A1 * | 10/2003 | Adams | H03M 1/0665 341/144 |
| 2019/0165820 | A1 * | 5/2019 | Xu | H03M 3/502 |
| 2024/0259028 | A1 | 8/2024 | Alvarez Fontecilla et al. | |

OTHER PUBLICATIONS

"U.S. Appl. No. 18/102,504, Final Office Action mailed Jan. 10, 2025", 11 pgs.

"U.S. Appl. No. 18/102,504, Notice of Allowance mailed May 1, 2025", 7 pgs.

"U.S. Appl. No. 18/102,504, Response filed Apr. 10, 2025 to Final Office Action mailed Jan. 10, 2025", 10 pgs.

"U.S. Appl. No. 18/102,504, Response filed Dec. 20, 2024 to Non Final Office Action mailed Sep. 20, 2024", 8 pgs.

Alvarez-Fontecilla, E, et al., "Understanding High-Resolution Dynamic Element Matching DACs", IEEE Circuits Syst. Magazine, (2023).

Baird, Rex, et al., "Linearity Enhancement of Multi-bit as A/D and D/A Converters Using Data Weighted Averaging", IEEE Trans. Circuits Syst. II: Analog Digit. Signal Process., vol. 42, No. 12, (Dec. 1995), 753-762.

Chen, Tao, et al., "A 14-bit 200-MHz Current-Steering DAC With Switching-Sequence Post-Adjustment Calibration", IEEE Journal of Solid-State Circuits, vol. 42, No. 11, (Nov. 2007), 2386-2394.

Galton, Ian, "Why Dynamic-Element-Matching DACs Work", IEEE Transactions on Circuits and Systems—II: Express Briefs, vol. 57, No. 2, (Feb. 2010), 69-74.

Huang, Hy, et al., "A 10-GS/s NRZ/Mixing DAC with Switching-Glitch Compensation Achieving SFDR >64/50 dBc Over the First/Second Nyquist Zone", IEEE J. Solid-State Circuits, vol. 56, No. 10, (Oct. 2021), 3145-3156.

Kong, D, et al., "A 600 MS/s DAC with Over 87-dB SFDR and 77-dB Peak SNDR Enabled by Adaptive Cancellation of Static and Dynamic Mis-match Error", IEEE J. Solid-State Circuits, vol. 54, No. 8, (Aug. 2019), 2219-2229.

Kong, D, et al., "Adaptive Cancellation of Static and Dynamic Mismatch Error in Continuous-Time DACs", IEEE Trans. Circuits Syst. I, Reg. Papers, vol. 65, No. 2, (Feb. 2018), 421-433.

Lee, DH, et al., "Low-Cost 14-Bit Current-Steering DAC With a Randomized Thermometer-Coding Method", IEEE Trans. Circuits Syst. II, Exp. Briefs, vol. 56, No. 2, (Feb. 2009), 137-141.

Lin, CH, et al., "A 16b 6GS/S Nyquist DAC with IMD <-90 dBc up to 1.9 GHz in 16 nm CMOS", IEEE Int. Solid-State Circuits Conf. (ISSCC) Dig. Tech. Papers, (Feb. 2018), 360-362.

Lin, WT, et al., "A 12-bit 40 nm DAC Achieving SFDR > 70 dB at 1.6 GS/s and IMD <-61dB at 2.8 GS/s with DEMDRZ Technique", IEEE J. Solid-State Circuits, vol. 49, No. 3, (Mar. 2014), 708-717.

Liu, Jianan, et al., "A 14-Bit 1.0-GS/s Dynamic Element Matching DAC with >80 dB SFDR up to the Nyquist", IEEE Int. Symp. Circuits Syst. (ISCAS), (2015), 1026-1029.

Mao, Wei, et al., "High Dynamic Performance Current-Steering DAC Design With Nested-Segment Structure", IEEE Transactions on Very Large Scale Integration (VLSI) Systems, (2018), 5 pgs.

Mohyar, Shaiful Nizam, et al., "Digital Calibration Algorithm for Half-Unary Current-Steering DAC for Linearity Improvement", Int. SoC Design Conf. (ISOCC), Jeju, South Korea, IEEE, (2014), 60-61.

Rakuljic, Nevena, et al., "Tree-Structured DEM DACs with Arbitrary Numbers of Levels", IEEE Transactions on Circuits and Systems—I: Regular Papers, vol. 57, No. 2, (Feb. 2010), 313-322.

Remple, J, et al., "The Effects of Inter-Symbol Interference in Dynamic Element Matching DACs", IEEE Trans. Circuit Syst. I: Reg. Papers, vol. 64, No. 1, (Jan. 2017), 14-23.

Schofield, W, et al., "A 16b 400MS/s DAC with <-80dBc IMD to 300MHz and <-160dBm/Hz noise power spectral density", IEEE Int. Solid-State Circuits Conf. (ISSCC) Dig. Tech. Papers, (Feb. 2003), 126-482.

Schreier, Richard, et al., "Understanding Delta-Sigma Data Converters", Hoboken, NJ, USA: Wiley, (2005), 455 pgs.

Tseng, WH, et al., "17.3 A 14b 16GS/s Time-Interleaving Direct-RF Synthesis DAC with T-DEM Achieving -70dBc IM3 up to 7.8GHz in 7nm", IEEE Int. Solid-State Circuits Conf. (ISSCC) Dig. Tech. Papers, (2023), 268-270.

Zhu, H, et al., "A Two-Parameter Calibration Technique Tracking Temperature Variations for Current Source Mismatch", IEEE Trans. Circuits Syst. II: Exp. Briefs, vol. 64, No. 4, (Apr. 2017), 387-391.

"International Application Serial No. PCT/US2024/012402, International Search Report mailed Jun. 5, 2024", 4 pgs.

"International Application Serial No. PCT/US2024/012402, Written Opinion mailed Jun. 5, 2024", 9 pgs.

"U.S. Appl. No. 18/102,504, Non Final Office Action mailed Sep. 20, 2024", 12 pgs.

Chan, Kok Lim, "Segmented Dynamic Element Matching for High-Resolution Digital-to-Analog Conversion", IEEE Transactions on Circuits and Systems I: Regular Papers, IEEE, US, vol. 55, No. 11, (Dec. 1, 2008), 3383-3392.

Nizam, Mohyar Shaiful, "SFDR Improvement Algorithms for Current-Steering DACs", Key Engineering Materials, vol. 643, (May 11, 2015), 101-108.

"U.S. Appl. No. 18/102,504, Notice of Allowance mailed Aug. 21, 2025", 7 pgs.

"International Application Serial No. PCT/US2024/012402, International Preliminary Report on Patentability mailed Aug. 7, 2025", 11 pgs.

* cited by examiner

FIG. 8

DIGITAL-TO-ANALOG CONVERTER (DAC) WITH DAC ELEMENT ERROR MATCHING

FIELD OF THE DISCLOSURE

The present disclosure generally relates to electronics, and more particularly to digital-to-analog converters (DACs) including arrangements for DACs and arrangements for configuring DACs.

BACKGROUND

A digital-to-analog converter (DAC) is a circuit or circuit component that is arranged to convert a digital input signal into a corresponding analog output signal. For example, the digital input signal may represent a value, such as a numerical value. The analog output signal may have a property, such as, for example a current or voltage level, that is proportional to or equal to the numerical value.

SUMMARY

Various examples described herein are directed to digital-to-analog converters (DACs) with DAC element error matching. In view of the disclosure above, various examples are set forth below. It should be noted that one or more features of an example, taken in isolation or combination, should be considered within the disclosure of this application.

Example 1 is a digital-to-analog converter circuit comprising: a plurality of single-bit DAC elements, each respective single-bit DAC element of the plurality of single-bit DAC elements being configured to receive a single-bit digital input and generate a corresponding DAC element output; an encoder circuit configured to generate a control signal, a number of asserted bits in the control signal being based at least in part on a digital input signal and a bit pattern of the control signal being based at least in part on a random signal, the encoder circuit being configured to generate the control signal such that values of the control signal having a first number of asserted bits include less than all bit patterns having the first number of asserted bits; a multiplexer circuit electrically coupled between the encoder circuit and the plurality of single-bit DAC elements, the multiplexer circuit being configured to modify the control signal to generate a noise-corrected control signal having a noise-corrected bit pattern, the noise-corrected bit pattern directing a first asserted bit of the noise-corrected control signal to activate a first single-bit DAC element and a second asserted bit of the noise-corrected control signal to activate a second single-bit DAC element, the first single-bit DAC element and the second single-bit DAC element being having respective errors that at least partially cancel; and a summer circuit configured to sum DAC element outputs of the plurality of single-bit DAC elements to generate an analog output signal.

In Example 2, the subject matter of Example 1 optionally includes the first single-bit DAC element having an error greater than an average error of the plurality of single-bit DAC elements and the second single-bit DAC element having an error less than the average error of the plurality of single-bit DAC elements.

In Example 3, the subject matter of Example 2 optionally includes the error of the first single-bit DAC element and the second single-bit DAC element being at least one of a gain error or a timing error.

In Example 4, the subject matter of any one or more of Examples 1-3 optionally include the first single-bit DAC element having a highest error among the plurality of single-bit DAC elements and the second single-bit DAC element having a lowest error among the plurality of single-bit DAC elements.

In Example 5, the subject matter of any one or more of Examples 1-4 optionally include the first single-bit DAC element and the second single-bit DAC element being the two single-bit DAC elements of the plurality of single-bit DAC elements having respective errors closest to zero.

In Example 6, the subject matter of any one or more of Examples 1-5 optionally include the encoder circuit comprising: a most significant bit input for receiving a most significant bit of the digital input signal; and a most significant bit swapper circuit configured to set a first portion of bits of the control signal equal to the most significant bit of the digital input signal when a first bit of the random signal is asserted and to set a second portion of bits of the control signal equal to the most significant bit of the digital input signal when the first bit of the random signal is not asserted.

In Example 7, the subject matter of Example 6 optionally includes the multiplexer circuit being configured to generate the noise-corrected control signal to map the first portion of bits of the control signal to a preselected portion of the plurality of single-bit DAC elements, the preselected portion of the plurality of single-bit DAC elements having respective errors that at least partially cancel.

In Example 8, the subject matter of any one or more of Examples 1-7 optionally include the encoder circuit comprising: a least significant bit input for receiving a least significant bit of the digital input signal; and a least significant bit swapper circuit configured to set a first bit of the control signal equal to the least significant bit of the digital input signal when a first bit of the random signal is asserted and to set a second bit of the control signal equal to the least significant bit of the digital input signal when the first bit of the random signal is not asserted.

Example 9 is a method for converting a digital signal to an analog signal, the method comprising: determining respective errors for a plurality of single-bit digital-to-analog converter (DAC) elements; selecting a first pair of single-bit DAC elements of the plurality of single-bit DAC elements the first pair of single-bit DAC elements comprising a first single-bit DAC element and a second single-bit DAC element having respective errors that at least partially cancel; generating a control signal such that values of the control signal having a first number of asserted bits include less than all bit patterns having the first number of asserted bits; and configuring a multiplexer of a DAC circuit to convert a control signal to a noise-corrected control signal, the control signal being generated based at least in part on a digital input signal and a random signal such that values of the control signal having a first number of asserted bits include less than all bit patterns having the first number of asserted bits, the noise-corrected bit pattern being arranged to direct a first asserted bit of the noise-corrected control signal to activate the first single-bit DAC element and a second asserted bit of the noise-corrected control signal to activate the second single-bit DAC element.

In Example 10, the subject matter of Example 9 optionally includes the first single-bit DAC element having an error greater than an average error of the plurality of single-bit DAC elements and the second single-bit DAC element having an error less than the average error of the plurality of single-bit DAC elements.

In Example 11, the subject matter of any one or more of Examples 9-optionally include the error of the first single-bit DAC element and the second single-bit DAC element being at least one of a gain error or a timing error.

In Example 12, the subject matter of any one or more of Examples 9-11 optionally include the first single-bit DAC element and the second single-bit DAC element being the two single-bit DAC elements of the plurality of single-bit DAC elements having respective errors closest to zero.

In Example 13, the subject matter of any one or more of Examples 9-12 optionally include selecting a second pair of single-bit DAC elements of the plurality of single-bit DAC elements, the second pair of single-bit DAC elements comprising a third single-bit DAC element and a fourth single-bit DAC element having respective errors that at least partially cancel.

In Example 14, the subject matter of Example 13 optionally includes the noise-corrected bit pattern being further arranged to direct a third asserted bit of the noise-corrected control signal to activate the third single-bit DAC element and a fourth asserted bit of the noise-corrected control signal to activate the fourth single-bit DAC element.

In Example 15, the subject matter of any one or more of Examples 9-14 optionally include selecting a first set of four single-bit DAC elements, a sum of errors of the four single-bit DAC elements being less than a sum of error of absolute values for the four single-bit DAC elements.

In Example 16, the subject matter of Example 15 optionally includes the noise-corrected bit pattern being further arranged to direct for asserted bits of the noise-corrected control signal to activate the first set of four single-bit DAC elements.

Example 17 is a digital-to-analog converter (DAC) circuit comprising: a plurality of single-bit DAC elements, each respective single-bit DAC element of the plurality of single-bit DAC elements being configured to receive a single-bit digital input and generate a corresponding DAC element output; means for generating a control signal, a number of asserted bits in the control signal being based at least in part on a digital input signal and an asserted bit pattern of the control signal being based at least in part on a random signal, the control signal being generated such that values of the control signal having a first number of asserted bits include less than all bit patterns having the first number of asserted bits; means for modifying the control signal to generate a noise-corrected control signal having a noise-corrected bit pattern, the noise-corrected bit pattern directing a first asserted bit of the noise-corrected control signal to activate a first single-bit DAC element and a second asserted bit of the noise-corrected control signal to activate a second single-bit DAC element, the first single-bit DAC element and the second single-bit DAC element having respective errors that at least partially cancel; and means for summing DAC element outputs of the plurality of single-bit DAC elements to generate an analog output signal.

In Example 18, the subject matter of Example 17 optionally includes the first single-bit DAC element having an error greater than an average error of the plurality of single-bit DAC elements and the second single-bit DAC element having an error less than the average error of the plurality of single-bit DAC elements.

In Example 19, the subject matter of Example 18 optionally includes the error of the first single-bit DAC element and the second single-bit DAC element being at least one of a gain error or a timing error.

In Example 20, the subject matter of any one or more of Examples 17-19 optionally include the first single-bit DAC element having a highest error among the plurality of single-bit DAC elements and the single-bit DAC element having a lowest error among the plurality of single-bit DAC elements.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 8 and 9 include various charts illustrating the selection of sets of 2 and 4 single-bit DAC elements for an example DAC including 8 single-bit DAC elements (e.g., L=8).

DESCRIPTION

Figure 1:
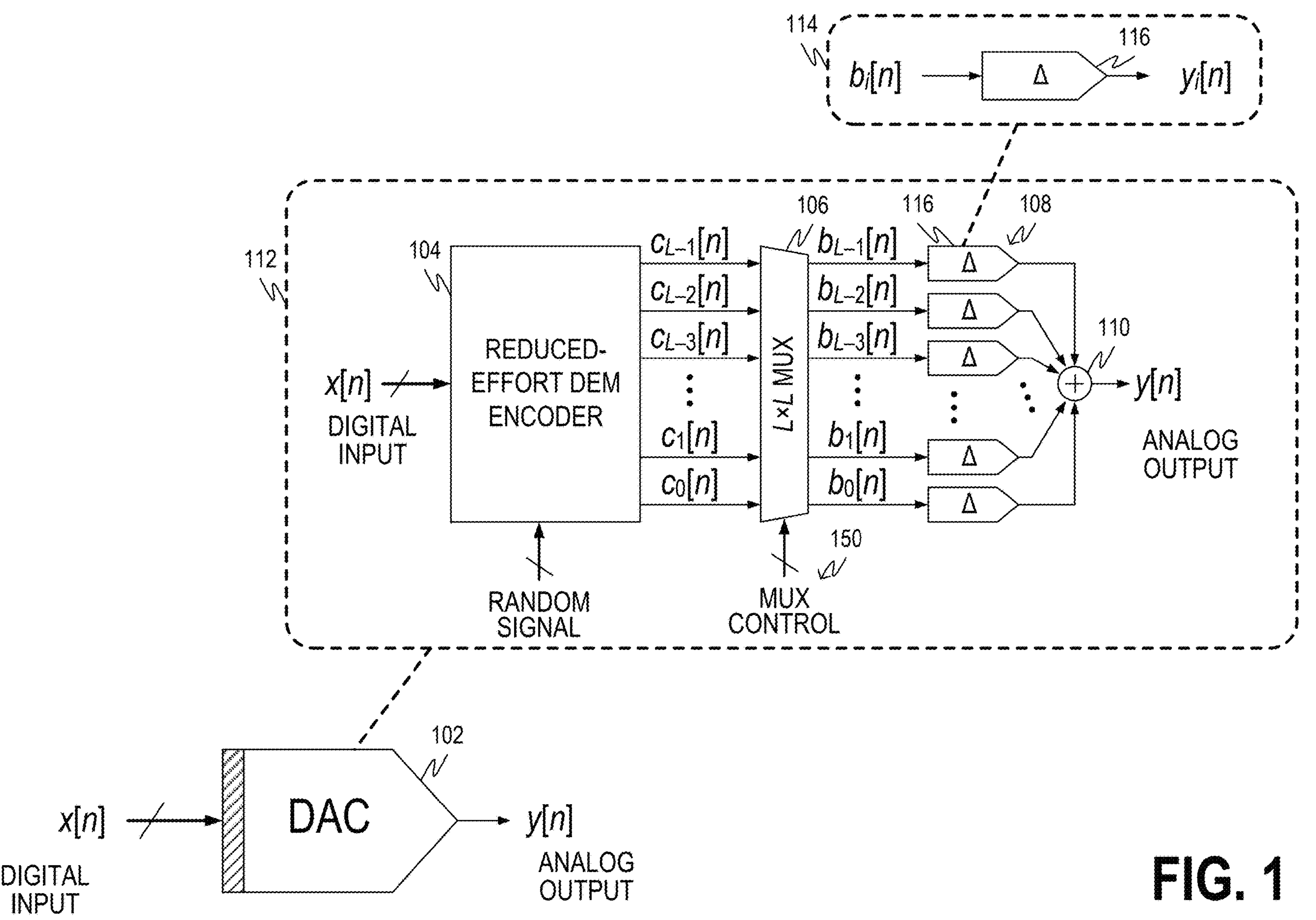
FIG. 1 is a diagram showing one example of a digital-to-analog converter (DAC) comprising a reduced-effort dynamic element matching (DEM) encoder and a multiplexer.

Some example digital-to-analog converter (DAC) designs utilize 1-bit or single-bit DAC elements. A single-bit DAC element is a circuit that is configured to receive a single-bit digital input and generate a corresponding DAC element output. The DAC element output is an analog signal having a property that corresponds to the state of the single-bit digital input. For example, the single-bit DAC element may generate the DAC element outputs such that a current, voltage, or other property of the DAC element output corresponds to or is indicative of the state of the single-bit digital input to the DAC element. If the single-bit digital input is asserted or high, the property of the DAC element output may have a first value. If the single-bit digital input is unasserted or low, the property of the DAC element output may have a second value different than the first value. In some examples, the value of the DAC element output property is higher (e.g., higher voltage, higher current, and/or the like) when the single-bit digital input is asserted or high.

A DAC utilizing single-bit DAC elements may comprise a number of the single-bit DAC elements as well as an encoder and a summer circuit. The encoder may receive a multi-bit digital input signal and generate a control signal.

The control signal is a multi-bit digital signal having a number of asserted bits and a bit pattern. The number of asserted bits of the control signal is the number of bits in the control signal that are high or asserted. The bit pattern of the control signal describes the positions of asserted bits. For example, a 3-bit digital signal in which two bits are asserted may have one of three different bit patterns: 011, 101, 110.

The encoder may be configured to generate the control signal such that the number of asserted bits in the control signal corresponds to a value (e.g., a binary value) encoded in the digital input signal. The DAC may be arranged to provide the control signal to the single-bit DAC elements such that each respective bit of the control signal corresponds to and is provided to a respective single-bit DAC element. The summer circuit may sum the DAC element outputs to generate the analog output of the DAC. For example, if the property of the DAC element outputs corresponding to the respective single-bit digital input is voltage, the summer circuit may generate an output having a voltage that is the sum of the voltage of the respective DAC element outputs. Because the number of asserted bits in the control signal corresponds to the value of the digital input signal, the sum of the DAC element outputs may be an analog signal having a property (e.g., voltage, current, and/or the like) that also corresponds to or is indicative of the value of the digital input signal.

In various examples, the encoder is configured to generate the control signal such that there is a one-to-one relationship between the number of asserted bits and the bit pattern of the control signal. In these example arrangements, each unique number of asserted bits is expressed using the same bit pattern. Accordingly, in these example arrangements, both the number of asserted bits in the control signal and the bit pattern of the control signal correspond to the digital input signal. For example, an encoder implementing unary or thermometer coding may operate in this manner.

When the number of asserted bits and the bit pattern of the control signal both correspond to the value of the digital input signal, it may generate a correspondence between values of the digital input signal and specific single-bit DAC elements, which may have unique and differing errors. For example, due to variations in fabrication and other factors, it may not be practical to obtain sets of single-bit DAC elements that exhibit identical properties. Different single-bit DAC elements may exhibit different gains, different propagation delays, and/or the like.

The gain of a single-bit DAC element describes the values of the DAC element output corresponding to the states of the single-bit digital input. The gain error for a single-bit DAC element may describe a difference between a nominal gain of the single-bit DAC element and the actual gain exhibited by a particular single-bit DAC element. Consider example single-bit DAC elements in which the value of the single-bit digital input is reflected in a voltage of the DAC element output. The nominal gain of the single-bit DAC element may describe a voltage level that is to be generated by the single-bit DAC element when its single-bit digital input is high or asserted. The gain error may describe a difference between the nominal voltage level and the actual voltage level of the DAC output generated by the single-bit DAC element when its single-bit input is high or asserted.

The propagation delay of a single-bit DAC element describes a difference in time between when the corresponding control signal bit is received at an input of the single-bit DAC and the time when the DAC output appears at the output of the single-bit DAC. Mismatches between propagation delays may lead to a timing error, where the timing error for a given single-bit DAC element describes a difference between a nominal propagation delay of the single-bit DAC element and the actual propagation delay exhibited by the given single-bit DAC element.

A DAC using single-bit DAC elements with different errors and an encoder for which the bit pattern and number of asserted bits of the control signal both correspond to the digital input signal can suffer from nonlinearities. Nonlinearities may occur when the relationship between the digital input signal and the analog output signal does not follow the equation of a line.

To illustrate, consider an example DAC with an encoder arranged to generate a control signal in which the number of asserted bits and the bit pattern of the control signal are both determined from the digital input signal. In this example, the encoder is arranged such that: (i) if the digital input signal is equal to 1, then a first single-bit DAC element receives an asserted single-bit digital input; (ii) if the digital input signal is equal to 2, then the first single-bit DAC element and a second single-bit DAC element receive an asserted single-bit digital input; and so on. In this example, the second single-bit DAC element has a positive gain error relative to the first single-bit DAC element. In this example, because of the difference in errors, adjacent input values may result in output values that do not fall on the same line. For example, the relationship between the output when the digital signal is equal to 1, the output when the digital signal is equal to 2, and the output when the digital signal is equal to 3 may not fall on the same line.

One example way of addressing nonlinearities in a DAC utilizing single-bit DAC elements is to use a dynamic element matching (DEM) encoder. A DEM encoder randomly changes the single-bit DAC elements that are activated for a given value of the digital input signal. In this way, the number of asserted bits may be equal to the value of the digital input signal, but the bit pattern of the control signal is selected randomly. In this way, differing errors in the single-bit DAC elements are randomized over values of the digital input signal. This may address nonlinearity, but may introduce and/or exacerbate an additional problem of noise. For example, although a DEM arrangement may prevent the errors of the respective single-bit DAC elements from appearing as nonlinear artifacts in the analog output signal, it may distribute the effects of the single-bit DAC element errors randomly, resulting in or increasing noise.

Various examples described herein address these and other challenges utilizing a DAC including a reduced-effort DEM encoder and a multiplexer positioned to receive the control signal generated by the encoder and generate a noise-corrected control signal that maps asserted bits (e.g., pairs of asserted bits) to complementary groups of single-bit DAC elements. Complementary groups of single-bit DAC elements may be single-bit DAC elements having errors that at least partially cancel.

A reduced-effort DEM encoder is configured to generate a control signal with a bit pattern that is less than fully random, but still cancels nonlinearities associated with non-random encoders. For example, a reduced-effort DEM encoder may generate a control signal having a number of asserted bits indicative of the value of the digital input signal and a bit pattern that is variable, but not fully random. For example, for each unique number of asserted bits, a reduced-effort DEM encoder may generate the control signal according to one of a limited number of bit patterns. The limited number of bit patterns for a given number of asserted bits may be less than all possible bit patterns having the given number of asserted bits. The particular bit pattern selected by the reduced-effort DEM encoder may be randomly selected from the limited number of bit patterns, for example, based on a random signal.

Consider an example 4-bit control signal and a digital input signal that indicates a control signal with 2 asserted bits. A 4-bit control signal with 2 asserted bits may have any one of the following bit patterns: 0011, 0101, 0110, 1001, 1010, or 1100. A reduced-effort DEM encoder may randomly select from a subset of, for example, two of the four possible bit patterns. Accordingly, when the control signal generated by the reduced-effort DEM is to have 2 asserted bits, it may output a control signal having one of two bit patterns in the example subset, depending on the value of the random signal.

Because the bits of the control signal map to or correspond to specific single-bit DAC elements, the control signal generated by a reduced-effort DEM encoder may mitigate and/or eliminate the effect of errors in the analog output signal. The multiplexer may take advantage of the predictability of the reduced-effort DEM encoder to address noise. For example, the multiplexer may modify the control signal generated by the reduced-effort DEM encoder to generate a noise-corrected control signal. The noise-corrected control signal may have a noise-corrected bit pattern that directs asserted bits to preselected groups of complementary single-bit DAC elements. This may cancel at least a portion of noise that may otherwise be present at the analog output signal.

In some examples, the arrangements described herein may result in a DAC that reduces both nonlinearities and noise in the analog output signal. For example, moving from a nonrandom encoder to a DEM encoder arrangement may create a trade-off between nonlinearity and noise. The DEM encoder arrangement may reduce nonlinearities generated by nonrandom encoder arrangements, but at the expense of increased noise. Various examples described herein may enjoy the benefits of reduced nonlinearity associated with DEM encoders while also reducing or eliminating the associated noise cost.

FIG. 1 is a diagram showing one example of a DAC 102 comprising a reduced-effort DEM encoder 104 and a multiplexer 106. The DAC 102 receives a digital input signal x[n], where x indicates the digital input signal and n represents time, indicating that the digital input signal varies with time. The output of the DAC 102 is an analog output signal y[n], where y indicates the analog output signal and n indicates time.

The breakout window 112 shows example components of the DAC 102. The DAC 102 includes a plurality of single-bit DAC elements 108. The number of single-bit DAC elements 108 in the DAC 102 is represented by L, where L may be any suitable value such as, for example, 2, 3, 4, 6, 8, 16, 32, and so on. In some examples, the value of L is equal to a power of 2. An additional breakout window 114 shows an example single-bit DAC element 116 of the plurality of single-bit DAC elements 108. The example single-bit DAC element 116 receives a single-bit digital input that, in this example, is a single-bit of the noise-corrected control signal represented by $b_i[n]$. The output of the single-bit DAC element 116 is a DAC output, represented in this example by $y_i[n]$. A property of the DAC output $y_i[n]$ such as, for example, a voltage, current, and/or the like, may correspond to the state of the single-bit digital input $b_i[n]$. Other single-bit DAC elements of the single-bit DAC elements 108 may be arranged and operate in a similar manner.

The reduced-effort DEM encoder 104 may receive the digital input signal x[n] and generate a control signal, represented in the example of FIG. 1 by c. The control signal c may have a number of bits equal to the number L of single-bit DAC elements 108 in the DAC 102. The reduced-effort DEM encoder 104 may also receive a random signal, which may be a digital signal. In some examples, the reduced-effort DEM encoder 104 may determine the number of asserted bits of the control signal c based on the digital input signal x[n]. For example, the number of asserted bits of the control signal c may be proportional to a value of the digital input signal x[n]. The bit pattern of the control signal c may be randomly selected, based on the random signal, from a set of less than all possible bit patterns including the determined number of asserted bits.

The multiplexer 106 may receive the control signal c and generate a noise-corrected control signal, indicated in the example of FIG. 1 by b. In some examples, the multiplexer 106 is an L-by-L multiplexer. For example, each bit of the noise-corrected control signal b may be set equal to a corresponding bit of the control signal c. In some examples, the multiplexer 106 also receives a multiplexer control signal. The multiplexer control signal may vary during operation of the DAC 102 or may be hard coded, hardwired, or otherwise set, for example, during a manufacturing or distribution of the DAC 102.

The multiplexer 106 may be configured, for example by the multiplexer configuration signal, to generate the noise-corrected control signal b so as to direct asserted bits of the control signal e to preselected sets of the plurality of single-bit DAC elements 108. The preselected sets of single-bit DAC elements 108 may be selected to have errors that at least partially cancel. In this way, noise introduced by the at least partially random assignment of asserted control signal bits to the single-bit DAC elements 108 may be at least partially canceled. The noise-corrected control signal b may be provided to the single-bit DAC elements 108, with single-bit DAC elements 108 receiving asserted bits of the noise-corrected control signal b and generating a corresponding DAC output. The DAC outputs of the single-bit DAC elements 108 may be added or summed at summer circuit 110, resulting in the analog output signal y[n].

Figure 2:
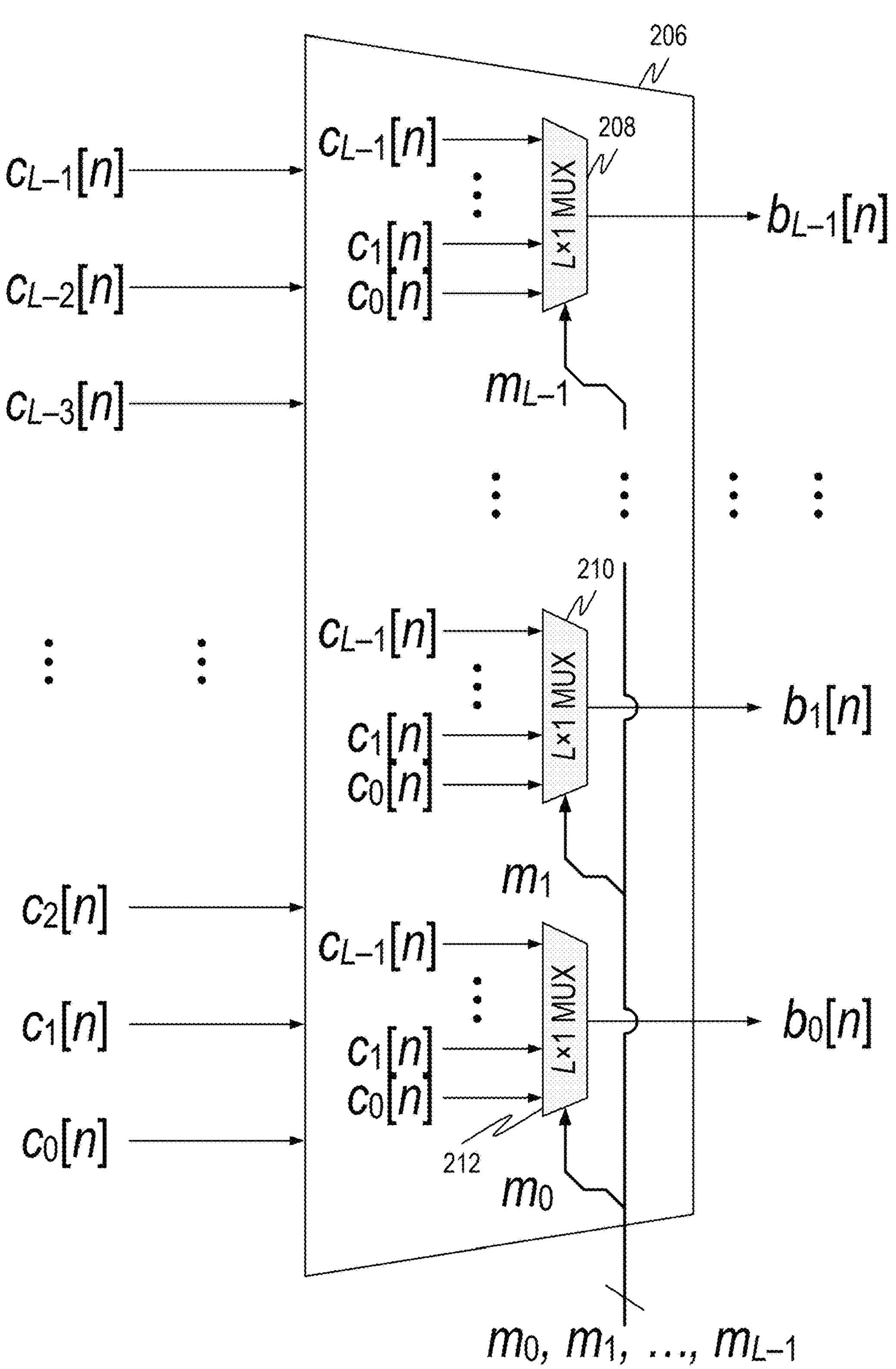
FIG. 2 is a diagram showing an example arrangement of a multiplexer.

FIG. 2 is a diagram showing an example arrangement of a multiplexer 206. The multiplexer 206 shows one example implementation of the multiplexer 106 of FIG. 1. The multiplexer 206 receives an L-bit control signal c and generates a corresponding L-bit noise-corrected control signal b. The multiplexer 206 may be an L-by-L multiplexer comprising respective L-by-1 multiplexers 208, 210, 212 corresponding to each of the L bits of the noise-corrected control signal b. In the example shown, each of the L-by-1 multiplexers receives each of the L bits of the control signal. In this way, the multiplexer 206 may be arranged to modify the control signal c to generate the noise-corrected control signal b based on the multiplexer control signal m.

Figure 3:
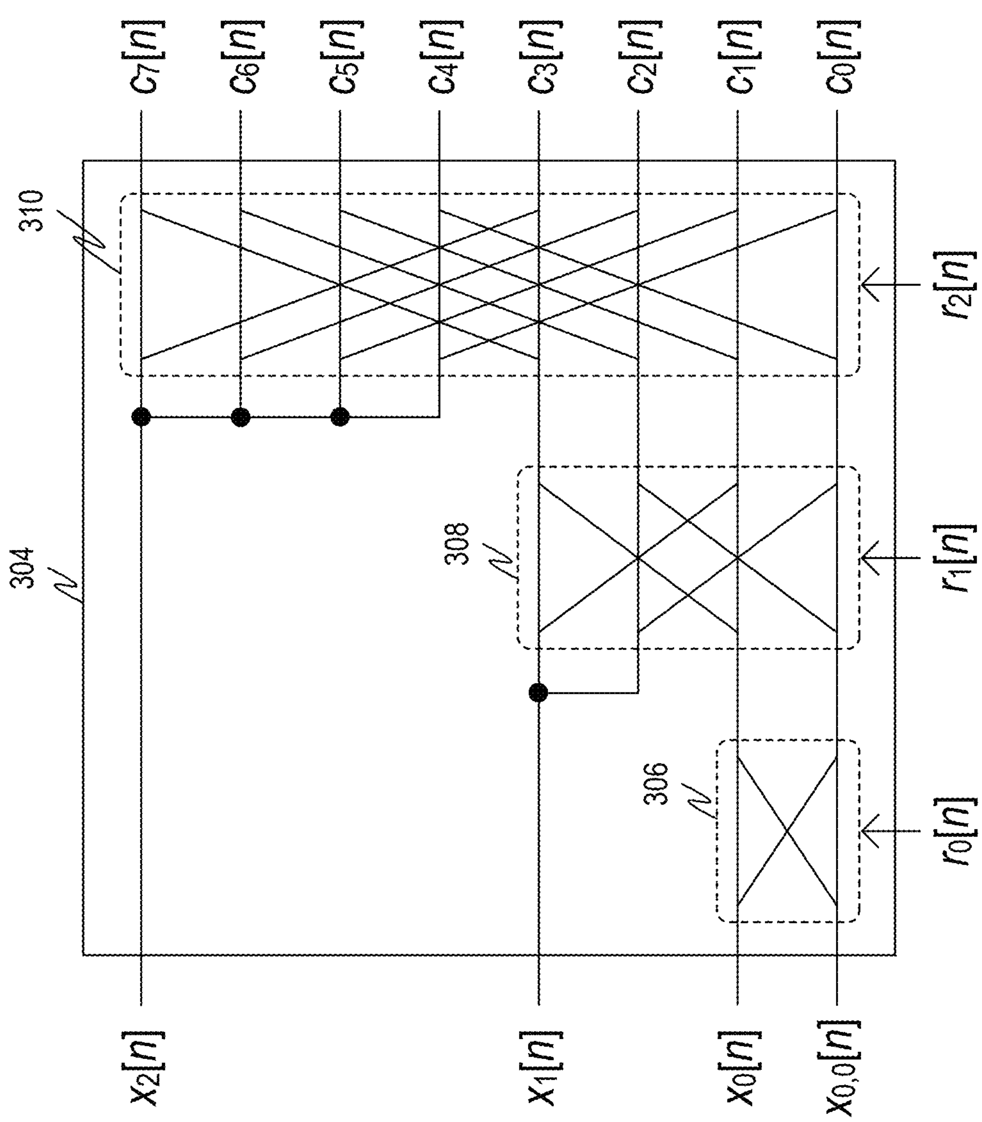
FIG. 3 shows an example reduced-effort DEM encoder including swapper circuits.

FIG. 3 shows an example reduced-effort DEM encoder 304 including swapper circuits 306, 308, 310. The reduced-effort DEM encoder 304 of FIG. 3 shows one example way that the reduced-effort DEM encoder 104 may be implemented. The example arrangement of FIG. 3 shows a digital input signal x and a 3-bit random signal r. The 3-bit random signal r [n] may be a random or pseudorandom digital number generated in any suitable manner. For example, the random signal r [n] may be generated using a Linear-Feedback Shift Register (LFSR).

The digital input signal x results in an 8-bit control signal c and a number L of single-bit DAC elements (not shown in FIG. 3) equal to 8. In this example, the 8-bits may take on nine distinct values, or nine numbers of asserted bits including 0 asserted bits through 8 asserted bits. Also, in this example, the digital input signal x has three binary-weighted bits $x_2$, $x_1$ and $x_0$, and an additional least significant bit (LSB) $x_{0,0}$. The additional LSB $x_{0,0}$ may be used, for example, to utilize a DAC including the reduced-effort DEM encoder 304 with other DACs to make higher-bit DACs.

The swapper circuit 306 is positioned between bits 0 and 1 of the control signal c. When bit number 0 of the random signal $r_0[n]$ is unasserted, the additional LSB of the digital input signal $x_{0,0}[n]$ is passed to bit 1 of the control signal $c_1[n]$ and the additional LSB $x_0[n]$ is passed to bit 0 of the control signal $c_0[n]$. When bit number 0 of the random signal $r_0[n]$ is asserted, the additional LSB of the digital input signal $x_{0,0}[n]$ is passed to bit 0 of the control signal $c_0[n]$ and the additional LSB $x_0[n]$ is passed to bit 1 of the control signal $c_1[n]$.

The swapper circuit 308 is positioned between bits 0-3 of the control signal c. When bit 1 of the random signal $r_1[n]$ is unasserted, the output of the swapper circuit 306 is passed to bits 0 $c_0[n]$ and 1 $c_1[n]$ of the control signal c and the value of bit 1 of the input signal $x_1[n]$ is passed to bits 2 $c_2[n]$ and 3 $c_3[n]$ of the control signal c. When bit 1 of the random signal $r_1[n]$ is asserted, the output of the swapper circuit 306 is passed to bits 2 $c_2[n]$ and 3 $c_3[n]$ of the control signal c and the value of bit 1 of the input signal $x_1[n]$ is passed to bits 0 $c_0[n]$ and 1 $c_1[n]$ of the control signal c.

The swapper circuit 310 is positioned between bits 0-7 of the control signal c. The swapper circuit 310 may direct the most significant bit of the input signal $x_2[n]$ and, in some examples, may be referred to as a most significant bit swapper circuit. When bit 2 of the random signal $r_2[n]$ is unasserted, the output of the swapper circuit 308 is passed to bits 0 $c_0[n]$, 1 $c_1[n]$, 2 $c_2[n]$, and 3 $c_3[n]$ of the control signal c and the value of bit 2 of the input signal $x_2[n]$ is passed to bits 4 $c_4[n]$, 5 $c_5[n]$, 6 $c_6[n]$, and 7 $c_7[n]$ of the control signal c. When bit 2 of the random signal $r_2[n]$ is asserted, the output of the swapper circuit 308 is passed to bits 4 $c_4[n]$, $c_5$ [n], 6 $c_6[n]$, and 7 $c_7[n]$ of the control signal c and the value of bit 2 of the input signal $x_2[n]$ is passed to bits 0 $c_0[n]$, 1 $c_1[n]$, 2 $c_2[n]$, and 3 $c_3[n]$ of the control signal c.

As a result of the swapper circuits 306, 308, 310, the number of asserted bits in the control signal c is determined based on the input digital signal x while the bit pattern of the control signal c is determined based on the value of the random signal r. In this arrangement, however, the number of possible bit patterns for each number of asserted bits is limited or less than all possible bit patterns.

Figure 4:
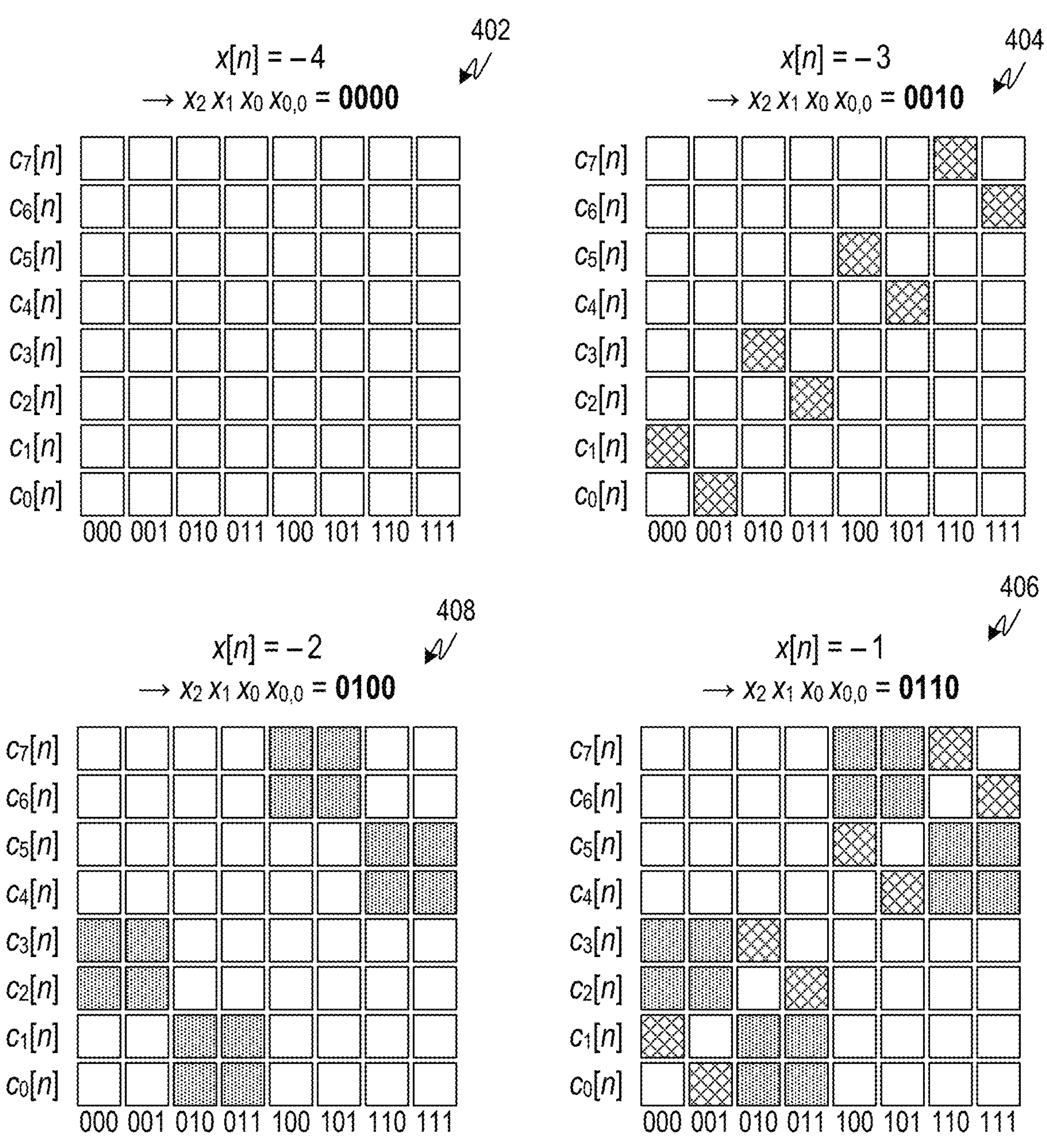
FIGS. 4 and 5 show various charts illustrating bit patterns of the control signal c for different values of the digital input signal x and random signal r in the example reduced-effort DEM encoder of FIG. 3.
Figure 5:
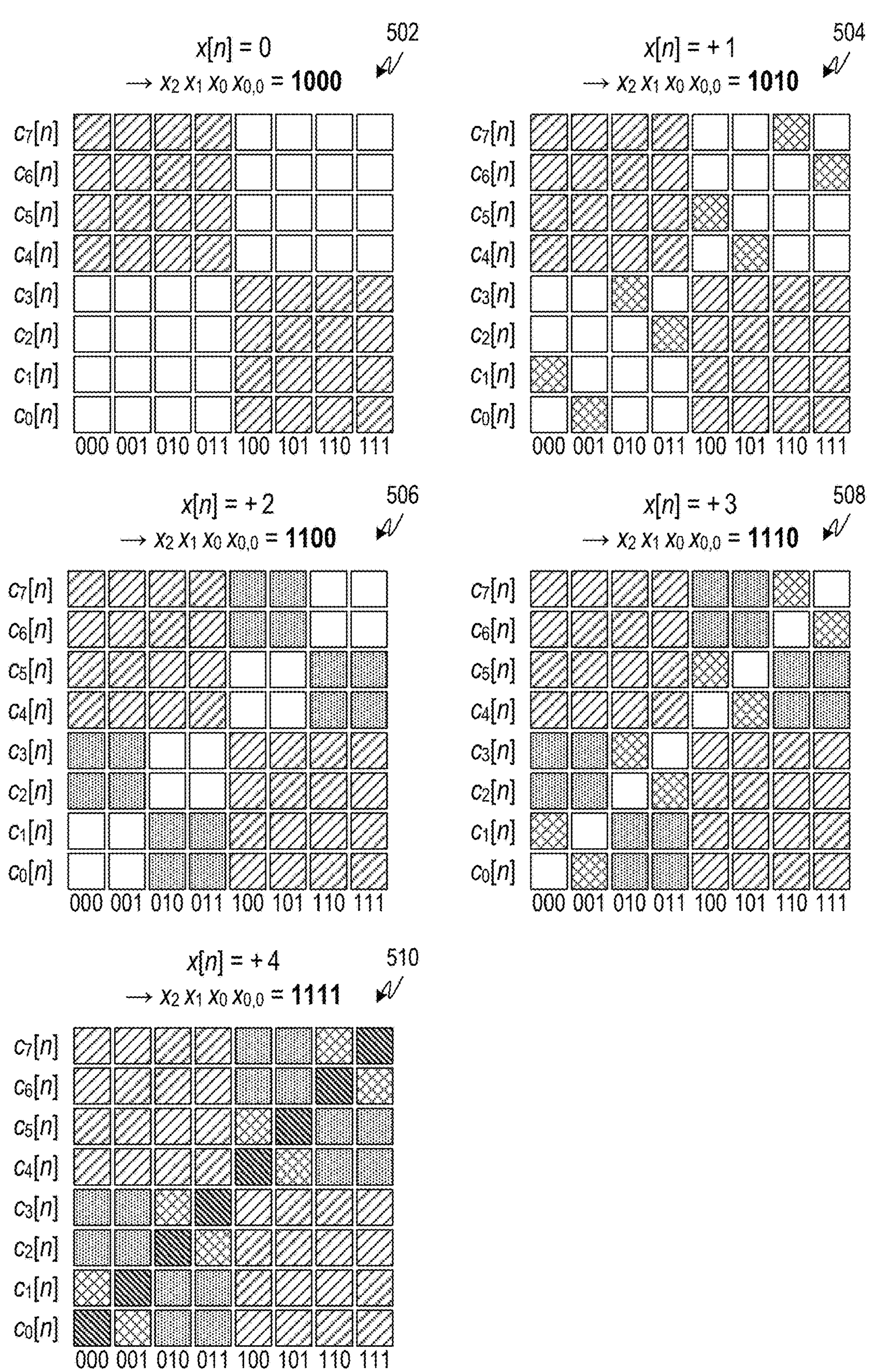

To illustrate further, FIGS. 4 and 5 show various charts illustrating bit patterns of the control signal c for different values of the digital input signal x and random signal r in the example reduced-effort DEM encoder 304. A chart 402 shows bit patterns of the control signal c for different values of the random signal r and control signal c when the digital input signal x is equal to 0000, which may, in some examples, be coded to the numerical value −4. For this value of the digital input signal x, there are no asserted bits in the control signal c. Accordingly, all bits of the control signal c (shown on the vertical axis) are zero (indicated by no shading) over all values of the random signal r (shown in the horizontal axis).

A chart 404 shows bit patterns of the control signal c for different values of the random signal r and control signal c when the digital input signal x is equal to 0010, which may, in some examples, be coded to the numerical value −3. For this value of the digital input signal x, the control signal c includes a single asserted bit. The single asserted bit may be any one of the bits 0-7 of the control signal c depending on values of the random signal r, as shown.

A chart 406 shows bit patterns of the control signal c for different values of the and random signal r and control signal c when the digital input signal x is equal to 0110, which may, in some examples, be coded to the numerical value −1. For this value of the digital input signal x, the control signal c includes three asserted bits. As shown, for all values of the random signal r, the three asserted bits are arranged in a bit pattern in which a two of the three asserted bits are in adjacent positions of the control signal c and a third asserted bit is positioned as shown by the chart 404. For example, no matter the value of the random signal r, at least one of the following pairs of control signal bits are asserted: $c_0$ and $c_1$, $c_2$ and $c_3$, $c_4$ and $c_5$, or $c_6$ and $c_7$. In some examples, the multiplexer 106 may be arranged to direct each of these pairs of control signal bits to complementary single-bit DAC elements.

A chart 408 shows bit patterns of the control signal c for different values of the and random signal r and control signal c when the digital input signal x is equal to 0100, which may, in some examples, be coded to the numerical value −2. For this value of the digital input signal x, the control signal c includes two asserted bits. In this example, for all values of the random signal r, the two asserted bits are always one of the pairs of control signal bits introduced with respect to the chart 406: $c_0$ and $c_1$, $c_2$ and $c_3$, $c_4$ and $c_5$, or $c_6$ and $c_7$.

Referring to FIG. 5, a chart 502 shows bit patterns of the control signal c for different values of the random signal r and control signal c when the digital input signal x is equal to 1000, which may, in some examples, be coded to the numerical value 0. For this value of the digital input signal x, the control signal c includes four asserted bits. As shown, for all values of the random signal r, the four asserted bits are arranged in one of two bit patterns. In a first bit pattern, bits $c_0$, $c_1$, $c_2$, and $c_3$ of the control signal c are asserted. In a second bit pattern, bits $c_3$, $c_4$, $c_5$, $c_6$, and $c_7$ of the control signal c are asserted. The first bit pattern is present when the random signal takes values 000, 001, 010, and 011 and the second bit pattern is present when the random signal takes values 100, 101, 110, and 111. In some examples, the multiplexer 106 may be arranged such that bits $c_0$, $c_1$, $c_2$, and $c_3$ of the control signal c are directed to a set of four complementary single-bit DAC elements 108 and bits $c_4$, $c_5$, $c_6$, and $c_7$ of the control signal c are directed to a second set of complementary single-bit DAC elements 108.

A chart 504 shows bit patterns of the control signal c for different values of the random signal r and control signal c when the digital input signal x is equal to 1010, which may, in some examples, be coded to the numerical value +1. For this value of the digital input signal x, the control signal c includes five asserted bits. As shown, four of the five asserted bits are present at the bits of the control signal c in the arrangement illustrated by the chart 502 and the fifth asserted bit is present at the bits of the control signal c in the arrangement illustrated by the chart 404.

A chart 506 shows bit patterns of the control signal c for different values of the random signal r and control signal c when the digital input signal x is equal to 1100, which may, in some examples, be coded to the numerical value +2. For this value of the digital input signal x, the control signal c includes six asserted bits. As shown, four of the six asserted bits are present at the bits of the control signal c in the arrangement illustrated by the chart 502 and the remaining two asserted bits are present at the bits of the control signal c in the arrangement illustrated by the chart 408.

A chart 508 shows bit patterns of the control signal c for different values of the random signal r and control signal c when the digital input signal x is equal to 1110, which may, in some examples, be coded to the numerical value +3. For this value of the digital input signal x, the control signal c includes seven asserted bits. As shown, four of the seven asserted bits are present at the bits of the control signal c in the arrangement illustrated by the chart 502, two of the asserted bits are present at the bits of the control signal c in the arrangement illustrated by the chart 408, and the seventh asserted bit is present at the bits of the control signal c in the arrangement illustrated by the chart 404.

A chart 510 shows bit patterns of the control signal c for different values of the random signal r and control signal c when the digital input signal x is equal to 1111, which may, in some examples, be coded to the numerical value +4. For this value of the digital input signal x, the control signal c includes eight asserted bits. In this example, all bits of the control signal c are asserted.

As shown in FIGS. 4 and 5, a reduced-effort DEM encoder may generate a control signal such that even numbers of asserted bits are always expressed at a limited number of adjacent bit positions at the control signal c. For example, when any two bits of the control signal c are asserted, at least one of the following pairs of bits are asserted: $c_0$ and $c_1$, $c_2$ and $c_3$, $c_4$ and $c_5$, and/or $c_6$ and $c_7$. Also, when any four bits of the control signal c are asserted, at least one of the following sets of four bits are asserted: bits $c_0$, $c_1$, $c_2$, and $c_3$ and/or bits $c_4$, $c_5$, $c_6$, and $c_7$. In some examples, this pattern may continue for reduced-effort DEM encoders having values of L greater than 8. For example, a reduced-effort DEM encoder having a value of L equal to 16 may express sets of 2 bits in one of 8 predetermined sets of 2 bits, sets of 4 bits in one of 4 predetermined sets of 4 adjacent bits, and sets of 8 bits in 2 predetermined sets of 8 bits, and so on.

In some examples, the predetermined sets of bits from the control signal may be directed to complementary sets of single-bit DAC elements. For example, referring to the arrangement of FIGS. 3-5, the multiplexer 106 may be arranged to direct bits $c_0$ and $c_1$ of the control signal c to a first pair of complementary single-bit DAC elements; $c_2$ and $c_3$ to a second pair of complementary single-bit DAC elements, bits $c_4$ and $c_5$ to a third pair of complementary single-bit DAC elements, and bits $c_6$ and $c_7$ to a fourth pair of complementary single-bit DAC elements. The multiplexer 106 may be further arranged to direct bits $c_0$, $c_1$, $c_2$, and $c_3$ of the control signal c to a first set of four complementary single-bit DAC elements and bits $c_4$, $c_5$, $c_6$, $c_7$ to a second set of four complementary single-bit DAC elements. In examples having a number L of bits in the control signal c greater than 8, predetermined sets of 8-bits, 16-bits and so on may be directed two corresponding sets of complementary single-bit DAC elements. In some examples, groupings of higher numbers of complementary single-bit DAC elements may be generated from smaller groups of complementary single-bit DAC elements. For example, predetermined sets of four complementary single-bit DAC elements may be generated by selecting two sets of two complementary single-bit DAC elements, as described herein. It will be appreciated that this pattern may be generalized over reduced-effort DEM encoder control signals c that use less than all possible bit patterns for at least a portion of possible numbers of asserted bits.

Figure 6:
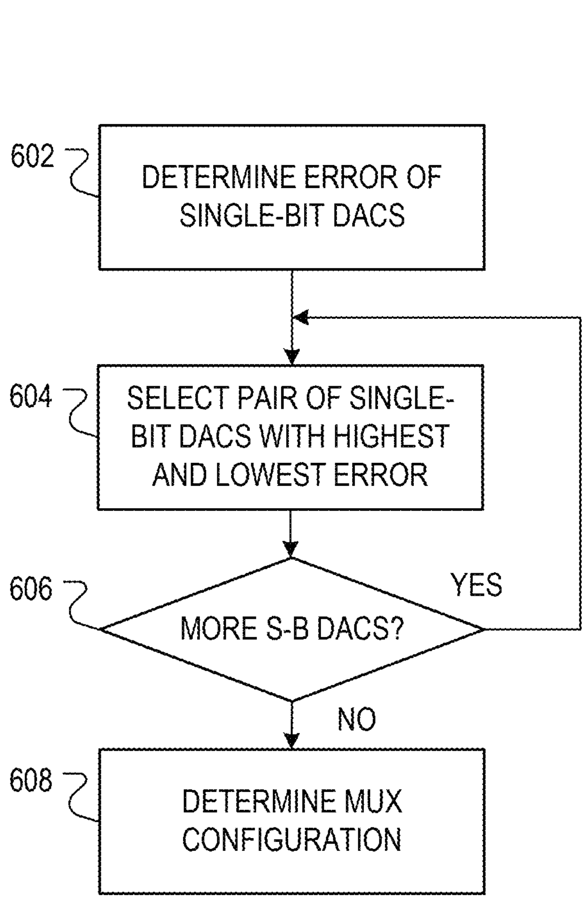
FIG. 6 is a flowchart showing one example of a process flow that may be executed to configure the multiplexer of FIG. 1.

FIG. 6 is a flowchart showing one example of a process flow 600 that may be executed to configure the multiplexer 106. In some examples, the process flow 600 may be performed during fabrication and/or manufacturing of the DAC 102. For example, the multiplexer control signal 150 may be hard coded or hardwired during fabrication or manufacturing. In other examples, the process flow 600 may be performed at a later time.

At operation 602, the errors of the single-bit DAC elements 108 may be measured. Any suitable error may be measured such as, for example, a gain error and/or a timing error. In some examples, multiple error types may be measured for each single-bit DAC element. At operation 604, a pair of single-bit DAC elements may be selected. The selected pair of single-bit DAC elements may include the single-bit DAC element having the highest error among remaining unselected single-bit DAC elements and the single-bit DAC element having the lowest error among remaining unselected single-bit DAC elements.

At operation 606, it may be determined whether there are at least two additional unselected single-bit DAC elements. If there are at least two additional unselected single-bit DAC elements, then the process flow 600 may return to operation 604, where an additional pair of single-bit DAC may be selected elements from the remaining unselected single-bit DAC elements. If there are not at least two unselected single-bit DAC elements at operation 606, then the configuration (e.g., multiplexer control signal m) for the multiplexer 106 may be determined at operation 608. As described herein, the multiplexer configuration (e.g., the multiplexer control signal 150) may be selected to direct commonly-asserted bit pairs of the control signal c to the pairs of single-bit DAC elements determined at operation 604.

Figure 7:
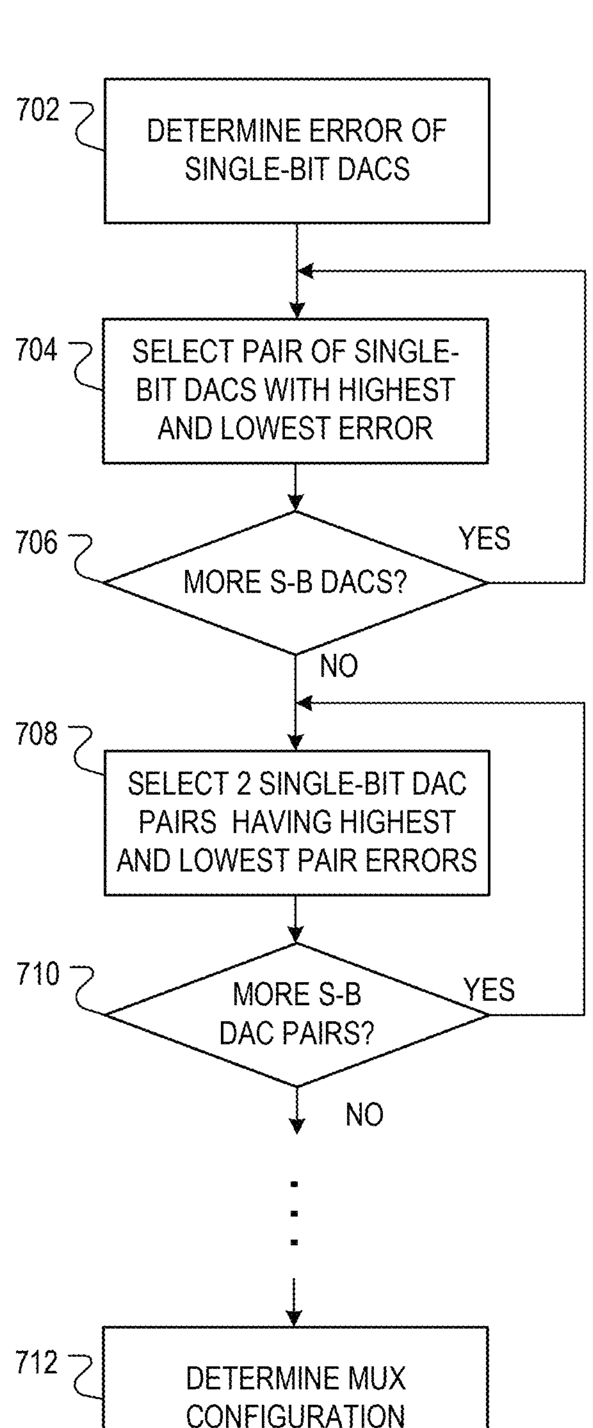
FIG. 7 is a flowchart showing another example of a process flow that may be executed to configure the multiplexer of FIG. 1.

FIG. 7 is a flowchart showing another example of a process flow 700 that may be executed to configure the multiplexer 106. In some examples, the process flow 700 may be performed during fabrication and/or manufacturing of the DAC 102. For example, the multiplexer control signal 150 may be hard coded or hardwired during fabrication or manufacturing. In other examples, the process flow 700 may be performed at a later time.

At operation 702, the errors of the single-bit DAC elements 108 may be measured. Any suitable error may be measured such as, for example, a gain error and/or a timing error. In some examples, multiple error types may be measured for each single-bit DAC element. At operation 704, a pair of single-bit DAC elements may be selected. The selected pair of single-bit DAC elements may include the single-bit DAC element having the highest error among remaining unselected single-bit DAC elements and the single-bit DAC element having the lowest error among remaining unselected single-bit DAC elements.

At operation 706, it may be determined whether there are at least two additional unselected single-bit DAC elements. If there are at least two additional unselected single-bit DAC elements, then the process flow 700 may return to operation 704, where an additional pair of single-bit DAC may be selected elements from the remaining unselected single-bit DAC elements. In some examples, the final pair of complementary single-bit DAC elements selected at operation 704 may include the two single-bit DAC elements having errors closest zero (e.g., closest to the average or nominal error of the single-bit DAC elements).

If there are not at least two unselected single-bit DAC elements at operation 706, then two single-bit DAC element pairs may be selected at operation 708. The two single-bit DAC element pairs selected at operation 708 may be selected from the pairs of single-bit DAC elements determined at operation 704. The pairs selected at operation 708 may include the un-selected pair having the highest error and the un-selected pair having the lowest error. At operation 710, it may be determined whether there are at least two additional unselected pairs of single-bit DAC elements. If there are at least two unselected pairs of single-bit DAC elements, then the process flow 700 may return to operation 708, where an additional two single-bit DAC element pairs may be selected from the remaining unselected pairs of single-bit DAC elements.

The process flow 700 may continue until a suitable number of sets of two, four, and so on single-bit DAC elements are selected. The number and type of selected single-bit DAC elements may differ for DACs having differing values of L. For example, a DAC having a 4-bit control signal c may pick pairs of complementary single-bit DAC elements. A DAC having an 8-bit control signal c, such as illustrated in FIGS. 4 and 5, may pick pairs of complementary single-bit DAC elements and sets of four complementary single-bit DAC elements. A DAC having a 16-bit control signal c may select sets of 2, 4, and 8 complementary single-bit DAC elements, and so on.

It will be appreciated that, in some example DACs, the value of L may not be equal to a power of 2. Accordingly, the number of single-bit DAC elements in a particular grouping may not be a power of 2. For example, some DACs may be configured such that single-bit DAC elements are arranged in groups of 6, 10, and/or other groupings that are not powers of 2. In some examples, a DAC may be arranged by forming groups including A0 single-bit DAC elements, groups including A1 groups of A0 single-bit DAC elements, groups including A2 groups of A1 single-bit DAC elements, and so on. In this example A0, A1, A2 and so on may be integers that may be powers of 2, but some or all of A0, A1, A2 and so may have values that are not powers of 2.

When all sets of two, four, and so on single-bit DAC elements are selected, the configuration (e.g., multiplexer control signal m) for the multiplexer 106 may be determined at operation 712. As described herein, the multiplexer configuration (e.g., the multiplexer control signal 150) may be selected to direct commonly-asserted sets of 2-bits, 4-bits, 8-bits, and so on from the control signal c, to the identified sets of 2, 4, 8, and so on single-bit DAC elements.

Figure 8:
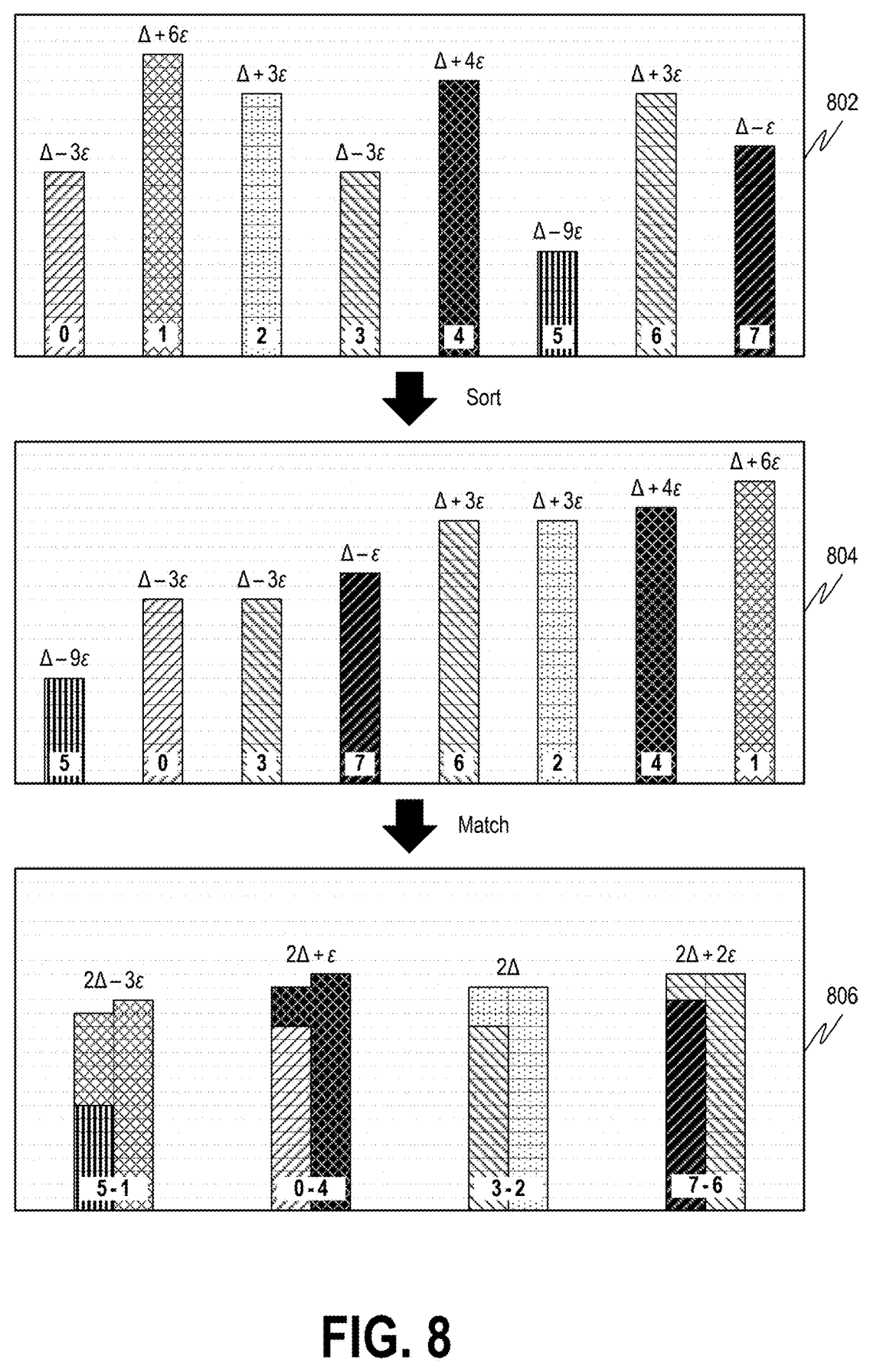
Figure 9:
Figure 9:
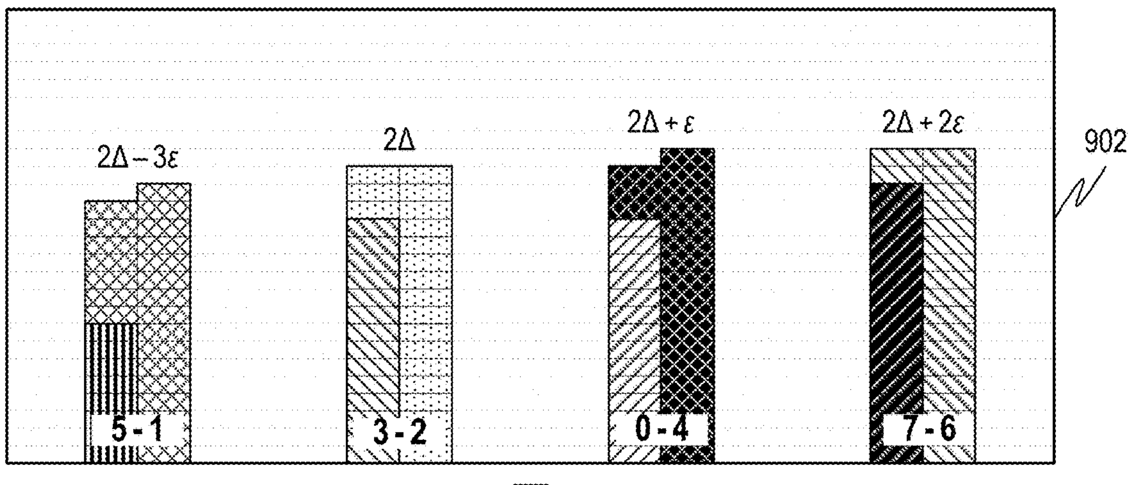
Figure 9:
Figure 9:
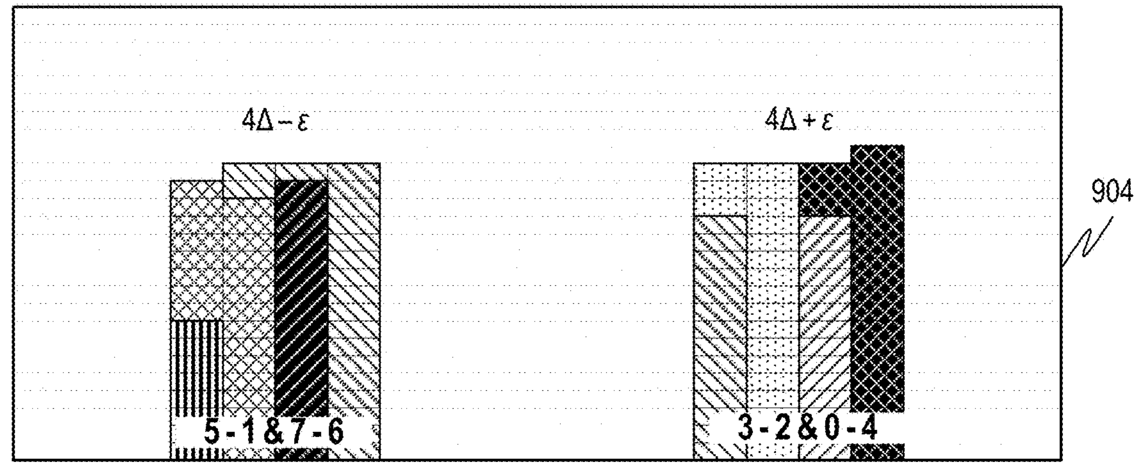

FIGS. 8 and 9 include various charts illustrating the selection of sets of 2 and 4 single-bit DAC elements for an example DAC including 8 single-bit DAC elements (e.g., L=8). A chart 802 in FIG. 8 shows errors associated with eight single-bit DAC elements, labeled 0-7. The errors of the respective single-bit DAC elements are illustrated graphically and numerically. For example, an average gain, propagation delay, and/or the like is indicated by delta A. In some examples, delta A is or is based on a nominal or rated gain, propagation delay, and/or the like of the single-bit DAC elements. The specific error difference between delta A and the gain, propagation delay, and/or the like of each single-bit DAC element is shown by an indicated multiple of epsilon (a). A chart 804 shows the single-bit DAC elements arranged in order from the lowest error, single-bit DAC element 5 with an error of $\Delta-9\varepsilon$, to the highest error, single-bit DAC element 1 with an error of $\Delta+6\varepsilon$.

As described herein, pairs of complementary single-bit DAC elements may be selected by selecting the highest and lowest error single-bit DAC elements, and then continuing to select the highest and lowest error single-bit DAC elements from remaining unselected single-bit DAC elements, until all pairs of single-bit DAC elements have been selected. Chart 806 shows an example result. In this example, a first pair of complementary single-bit DAC elements includes single-bit DAC element 5 and single-bit DAC element 1. A second pair of complementary single-bit DAC elements includes single-bit DAC element 0 and single-bit DAC element 4. A third pair of complementary single-bit DAC elements includes single-bit DAC element 3 and single-bit DAC element 2. A fourth pair of complementary single-bit DAC elements includes single-bit DAC element 7 and single-bit DAC element 6.

The chart 806 demonstrates how the errors of the complementary pairs of single-bit DAC elements at least partially cancel. For example, the sum of the error of the single-bit DAC element 5 and the error of the single-bit DAC element 1 is $2\Delta-3\varepsilon$, which is smaller than or equal to the individual errors of either single-bit DAC element. The other selected pairs of single-bit DAC elements also have some errors that are less than the individual errors of the respective single-bit DAC elements. In some examples, the sum of the errors of each pair of complementary single-bit DAC elements is less than a sum of the absolute values of the errors of the respective complementary single-bit DAC elements.

Referring to FIG. 9, chart 902 shows the pairs of complementary single-bit DAC elements sorted in order of the error of the pairs from the pair having the lowest error (single-bit DAC element numbers 5 and 1) to the pair having the highest error (single-bit DAC element numbers 7 and 6). Matching the pairs of complementary single-bit DAC elements, for example as described herein, may lead to groups of four complementary single-bit DAC elements. The chart 904 shows to groups of four complementary single-bit DAC elements. For example, the pair having the lowest error (single-bit DAC element numbers 5 and 1) may be matched with the pair having the highest error (single-bit DAC element numbers 7 and 6). The sum of the errors of the single-bit DAC element numbers 5, 1, 7, and 6 may be $2\Delta-3\varepsilon$, which is smaller than the error of either pair by itself. A second group of four complementary single-bit DAC elements is illustrated to include single-bit DAC element numbers 3, 2, 0, and 4. In some examples, the sum of the errors of the respective groups of complementary single-bit DAC elements may be less than a sum of the absolute values of the errors of the single-bit DAC elements.

Figure 10:
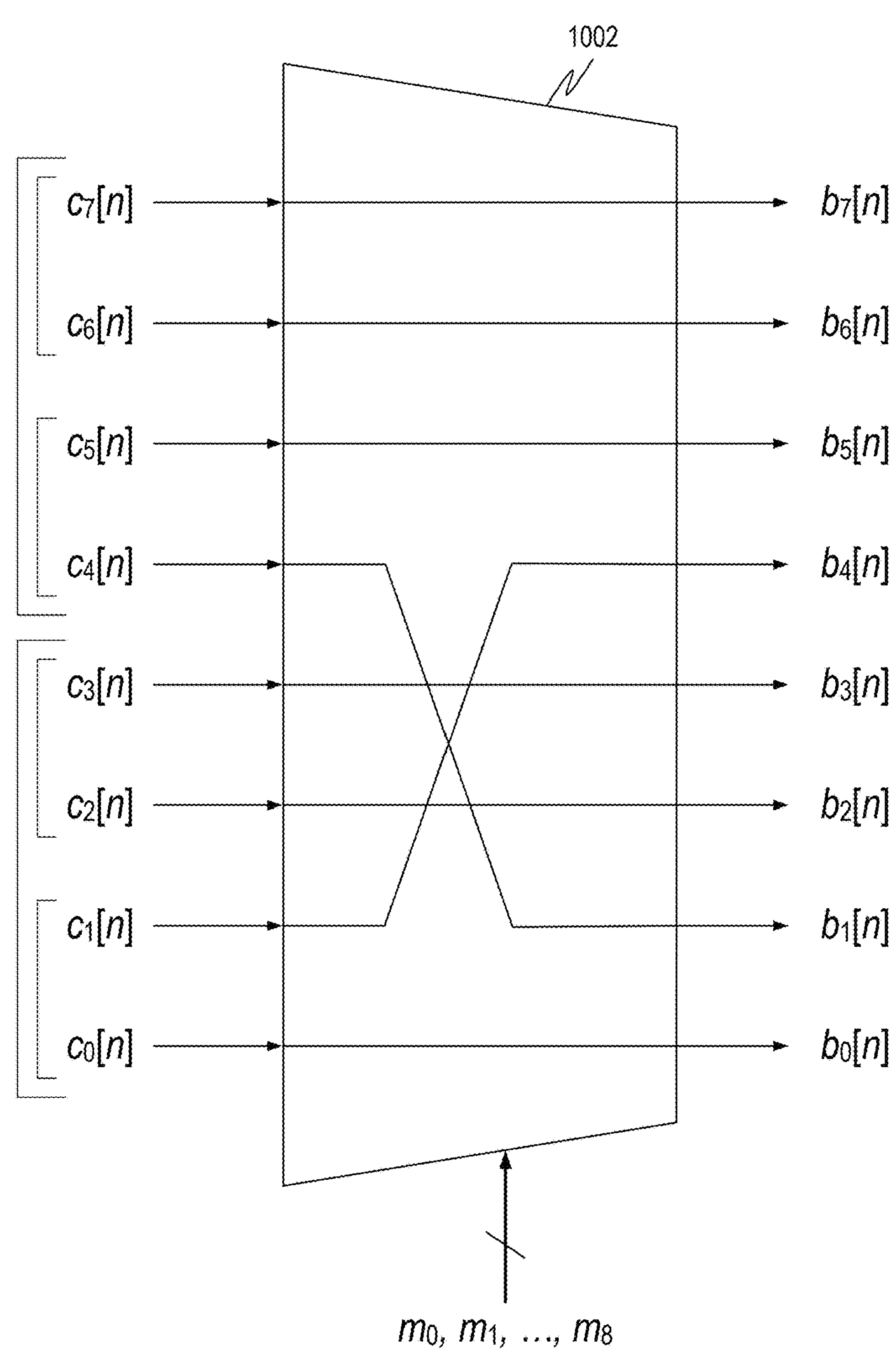
FIG. 10 is a diagram showing one example of a multiplexer that is arranged to generate a noise-corrected control signal b based on the arrangement of 8 single-bit DAC elements illustrated by FIGS. 8 and 9.

FIG. 10 is a diagram showing one example of a multiplexer 1002 that is arranged to generate a noise-corrected control signal b based on the arrangement of 8 single-bit DAC elements illustrated by FIGS. 8 and 9. For example, to implement the groupings of single-bit DAC elements shown at chart 904, bit $c_4$ of the control signal c may be mapped to bit $b_1$ of the noise-corrected control signal and bit $c_1$ of the control signal c may be mapped to bit $b_4$ of the noise-corrected control signal.

Figure 11:
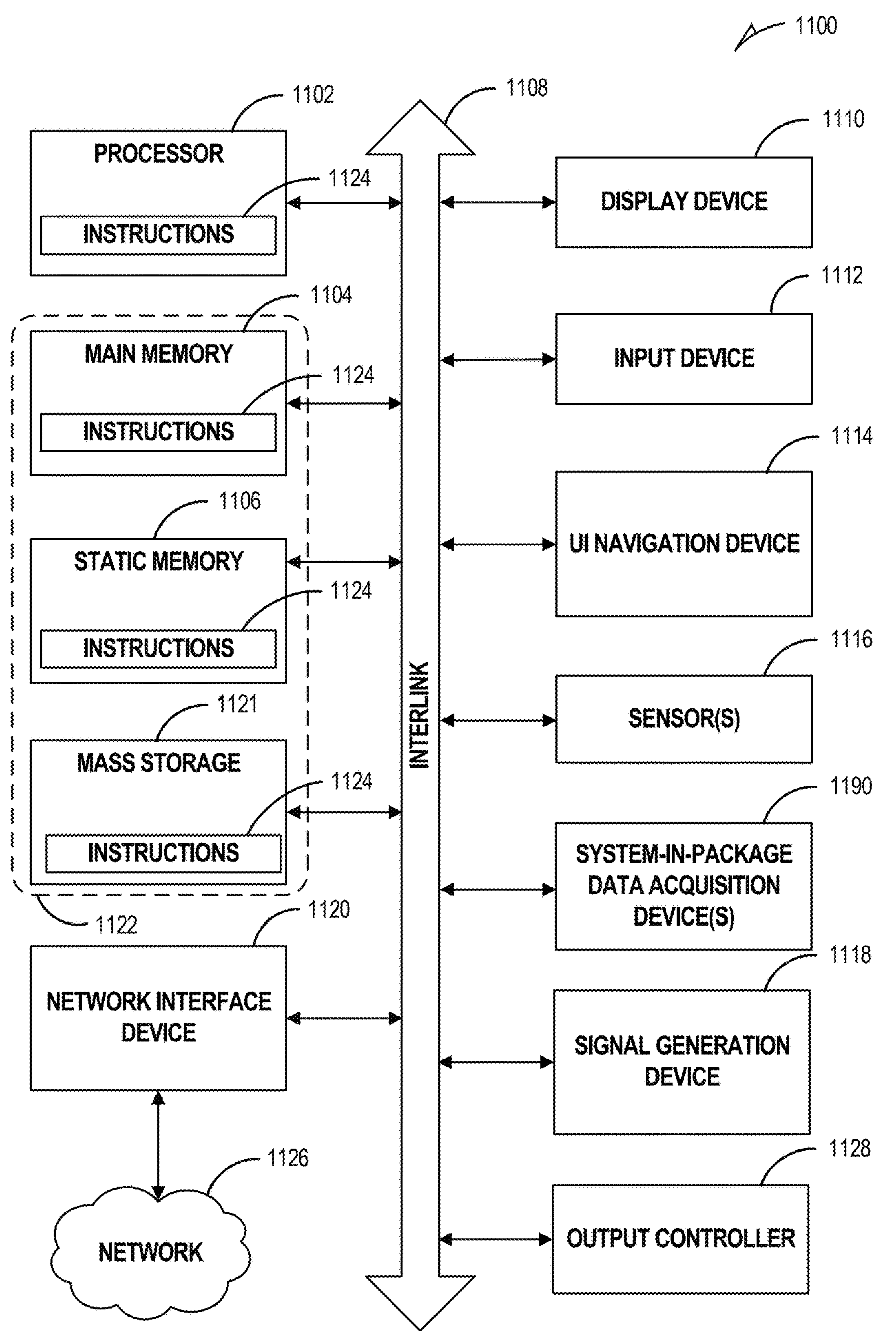
FIG. 11 is a block diagram of an example machine upon which any one or more of the techniques (e.g., methodologies) discussed herein may be performed.

FIG. 11 is a block diagram of an example machine 1100 upon which any one or more of the techniques (e.g., methodologies) discussed herein may be performed. In alternative examples, the machine 1100 may operate as a standalone device or may be connected (e.g., networked) to other machines. In a networked deployment, the machine 1100 may operate in the capacity of a server machine, a client machine, or both in server-client network environments. In an example, the machine 1100 may act as a peer machine in a peer-to-peer (P2P) (or other distributed) network environment. The machine 1100 may be a personal computer (PC), a tablet PC, a set-top box (STB), a personal digital assistant (PDA), a mobile telephone, a web appliance, an IoT device, an automotive system, an aerospace system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant-massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1100 may include a hardware processing unit 1102 (e.g., a central processing unit (CPU), a graphics processing unit (GPU), a hardware processor core, or any combination thereof, such as a memory controller, etc.), a main memory 1104, and a static memory 1106, some or all of which may communicate with each other via an interlink (e.g., bus) 1108. The machine 1100 may further include a display device 1110, an alphanumeric input device 1112 (e.g., a keyboard), and a user interface (UI) navigation device 1114 (e.g., a mouse). In an example, the display device 1110, alphanumeric input device 1112, and UI navigation device 1114 may be a touchscreen display. The machine 1100 may additionally include a storage device 1122 (e.g., drive unit); a signal generation device 1118 (e.g., a speaker); a network interface device 1120; one or more sensors 1116, such as a Global Positioning System (GPS) sensor, wing sensor, mechanical device sensor, temperature sensor, bridge sensor, audio sensor, industrial sensor, a compass, an accelerometer, or other sensors; and one or more system-in-package data acquisition devices 1190. The system-in-package data acquisition device(s) 1190 may implement some or all of the functionality of the electrolyzer systems, discussed above. The machine 1100 may include an output controller 1128, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The storage device 1122 may include a machine-readable medium on which is stored one or more sets of data structures or instructions 1124 (e.g., software) embodying or utilized by any one or more of the techniques or functions described herein. The instructions 1124 may also reside, completely or at least partially, within the main memory 1104, within the static memory 1106, or within the hardware processing unit 1102 during execution thereof by the machine 1100. In an example, one or any combination of the hardware processing unit 1102, the main memory 1104, the static memory 1106, or the storage device 1122 may constitute the machine-readable medium.

While the machine-readable medium is illustrated as a single medium, the term "machine-readable medium" may include a single medium or multiple media (e.g., a centralized or distributed database, or associated caches and servers) configured to store the one or more instructions 1124.

The term "machine-readable medium" may include any transitory or non-transitory medium that is capable of storing, encoding, or carrying transitory or non-transitory instructions for execution by the machine 1100 and that cause the machine 1100 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1124 (e.g., software, programs, an operating system (OS), etc.) or other data that are stored on the storage device 1121 can be accessed by the main memory 1104 for use by the hardware processing unit 1102. The main memory 1104 (e.g., DRAM) is typically fast, but volatile, and thus a different type of storage from the storage device 1121 (e.g., an SSD), which is suitable for long-term storage, including while in an "off" condition. The instructions 1124 or data in use by a user or the machine 1100 are typically loaded in the main memory 1104 for use by the hardware processing unit 1102. When the main memory 1104 is full, virtual space from the storage device 1121 can be allocated to supplement the main memory 1104; however, because the storage device 1121 is typically slower than the main memory 1104, and write speeds are typically at least twice as slow as read speeds, use of virtual memory can greatly reduce user experience due to storage device latency (in contrast to the main memory 1104, e.g., DRAM). Further, use of the storage device 1121 for virtual memory can greatly reduce the usable lifespan of the storage device 1121.

The instructions 1124 may further be transmitted or received over a communications network 1126 using a transmission medium via the network interface device 1120 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone Service (POTS) networks, and wireless data networks (e.g., Institute of Electrical and Electronics Engineers (IEEE) 802.11 family of standards known as Wi-Fi®, IEEE 802.16 family of standards known as WiMax®, IEEE 802.15.4 family of standards, P2P networks), among others. In an example, the network interface device 1120 may include one or more physical jacks (e.g., Ethernet, coaxial, or phone jacks) or one or more antennas to connect to the communications network 1126. In an example, the network interface device 1120 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible or intangible medium that is capable of storing, encoding, or carrying instructions for execution by the machine 1100, and includes digital or analog communications signals or other tangible or intangible media to facilitate communication of such software.

Each of the non-limiting examples or examples described herein may stand on its own, or may be combined in various permutations or combinations with one or more of the other examples.

The above detailed description includes references to the accompanying drawings, which form a part of the detailed description. The drawings show, by way of illustration, specific examples in which the inventive subject matter may be practiced. These examples are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more examples thereof), either with respect to a particular example (or one or more examples thereof), or with respect to other examples (or one or more examples thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following examples, the terms "including" and "comprising" are open-ended; that is, a system, device, article, composition, formulation, or process that includes elements in addition to those listed after such a term in an aspect are still deemed to fall within the scope of that aspect. Moreover, in the following examples, the terms "first," "second," "third," and so forth are used merely as labels and are not intended to impose numerical requirements on their objects.

Method examples described herein may be machine- or computer-implemented at least in part. Some examples may include a computer-readable medium or machine-readable medium encoded with transitory or non-transitory instructions operable to configure an electronic device to perform methods as described in the above examples. An implementation of such methods may include code, such as microcode, assembly-language code, a higher-level-language code, or the like. Such code may include transitory or non-transitory computer-readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read-only memories (ROMs), and the like.

The above description is intended to be illustrative, and not restrictive. For example, the above-described examples (or one or more examples thereof) may be used in combination with each other. Other examples may be used, such as by one of ordinary skill in the art upon reviewing the above description. The Abstract is provided to comply with 37 C.F.R. § 1.72 (b), to allow the reader to quickly ascertain the nature of the technical disclosure. It is submitted with the understanding that it will not be used to interpret or limit the scope or meaning of the claims. Also, in the above detailed description, various features may be grouped together to streamline the disclosure. This should not be interpreted as intending that a disclosed feature not listed in the list of claims is essential to any aspect. Rather, inventive subject matter may lie in less than all features of a particular disclosed example. Thus, the following examples are hereby incorporated into the detailed description as examples or examples, with each claim standing on its own as a separate example, and it is contemplated that such examples may be combined with each other in various combinations or permutations. The scope of the inventive subject matter should be determined with reference to the appended claims, along with the full scope of equivalents to which such claims are entitled.

The invention claimed is:

1. A digital-to-analog converter (DAC) circuit comprising:

a plurality of single-bit DAC elements, each respective single-bit DAC element of the plurality of single-bit DAC elements being configured to receive a single-bit digital input and generate a corresponding DAC element output;

an encoder circuit configured to generate a control signal, a number of asserted bits in the control signal being based at least in part on a digital input signal and a bit pattern of the control signal being based at least in part on a random signal, the encoder circuit being configured to generate the control signal such that values of the control signal having a first number of asserted bits include less than all bit patterns having the first number of asserted bits;

a multiplexer circuit electrically coupled between the encoder circuit and the plurality of single-bit DAC elements, the multiplexer circuit being configured to modify the control signal to generate a noise-corrected control signal having a noise-corrected bit pattern, the noise-corrected bit pattern directing a first asserted bit of the noise-corrected control signal to activate a first single-bit DAC element and a second asserted bit of the noise-corrected control signal to activate a second single-bit DAC element, the first single-bit DAC element and the second single-bit DAC element being preselected to have respective errors that at least partially cancel; and a summer circuit configured to sum DAC element outputs of the plurality of single-bit DAC elements to generate an analog output signal.

2. The DAC circuit of claim 1, the first single-bit DAC element having an error greater than an average error of the plurality of single-bit DAC elements and the second single-bit DAC element having an error less than the average error of the plurality of single-bit DAC elements.

3. The DAC circuit of claim 2, the error of the first single-bit DAC element and the second single-bit DAC element being at least one of a gain error or a timing error.

4. The DAC circuit of claim 1, the first single-bit DAC element having a highest error among the plurality of single-bit DAC elements and the second single-bit DAC element having a lowest error among the plurality of single-bit DAC elements.

5. The DAC circuit of claim 1, the first single-bit DAC element and the second single-bit DAC element being the two single-bit DAC elements of the plurality of single-bit DAC elements having respective errors closest to zero.

6. The DAC circuit of claim 1, the encoder circuit comprising:

a most significant bit input for receiving a most significant bit of the digital input signal; and a most significant bit swapper circuit configured to set a first portion of bits of the control signal equal to the most significant bit of the digital input signal when a first bit of the random signal is asserted and to set a second portion of bits of the control signal equal to the most significant bit of the digital input signal when the first bit of the random signal is not asserted.

7. The DAC circuit of claim 6 the multiplexer circuit being configured to generate the noise-corrected control signal to map the first portion of bits of the control signal to a preselected portion of the plurality of single-bit DAC elements, the preselected portion of the plurality of single-bit DAC elements having respective errors that at least partially cancel.

8. The DAC circuit of claim 1, the encoder circuit comprising:

a least significant bit input for receiving a least significant bit of the digital input signal; and a least significant bit swapper circuit configured to set a first bit of the control signal equal to the least significant bit of the digital input signal when a first bit of the random signal is asserted and to set a second bit of the control signal equal to the least significant bit of the digital input signal when the first bit of the random signal is not asserted.

9. A method for converting a digital signal to an analog signal, the method comprising:

determining respective errors for a plurality of single-bit digital-to-analog converter (DAC) elements;

selecting a first pair of single-bit DAC elements of the plurality of single-bit DAC elements the first pair of single-bit DAC elements comprising a first single-bit DAC element and a second single-bit DAC element, the first pair of single-bit DAC elements being preselected to have respective errors that at least partially cancel;

generating a control signal such that values of the control signal having a first number of asserted bits include less than all bit patterns having the first number of asserted bits; and configuring a multiplexer of a DAC circuit to convert a control signal to a noise-corrected control signal, the control signal being generated based at least in part on a digital input signal and a random signal such that values of the control signal having a first number of asserted bits include less than all bit patterns having the first number of asserted bits, the noise-corrected bit pattern being arranged to direct a first asserted bit of the noise-corrected control signal to activate the first single-bit DAC element and a second asserted bit of the noise-corrected control signal to activate the second single-bit DAC element.

10. The method of claim 9, the first single-bit DAC element having an error greater than an average error of the plurality of single-bit DAC elements and the second single-bit DAC element having an error less than the average error of the plurality of single-bit DAC elements.

11. The method of claim 9, the error of the first single-bit DAC element and the second single-bit DAC element being at least one of a gain error or a timing error.

12. The method of claim 9, the first single-bit DAC element and the second single-bit DAC element being the two single-bit DAC elements of the plurality of single-bit DAC elements having respective errors closest to zero.

13. The method of claim 9, further comprising selecting a second pair of single-bit DAC elements of the plurality of single-bit DAC elements, the second pair of single-bit DAC elements comprising a third single-bit DAC element and a fourth single-bit DAC element having respective errors that at least partially cancel.

14. The method of claim 13, the noise-corrected bit pattern being further arranged to direct a third asserted bit of the noise-corrected control signal to activate the third single-bit DAC element and a fourth asserted bit of the noise-corrected control signal to activate the fourth single-bit DAC element.

15. The method of claim 9, further comprising selecting a first set of four single-bit DAC elements, a sum of errors of the four single-bit DAC elements being less than a sum of error of absolute values for the four single-bit DAC elements.

16. The method of claim 15, the noise-corrected bit pattern being further arranged to direct for asserted bits of the noise-corrected control signal to activate the first set of four single-bit DAC elements.

17. A digital-to-analog converter (DAC) circuit comprising:

a plurality of single-bit DAC elements, each respective single-bit DAC element of the plurality of single-bit DAC elements being configured to receive a single-bit digital input and generate a corresponding DAC element output;

means for generating a control signal, a number of asserted bits in the control signal being based at least in part on a digital input signal and an asserted bit pattern of the control signal being based at least in part on a random signal, the control signal being generated such that values of the control signal having a first number of asserted bits include less than all bit patterns having the first number of asserted bits;

means for modifying the control signal to generate a noise-corrected control signal having a noise-corrected bit pattern, the noise-corrected bit pattern directing a first asserted bit of the noise-corrected control signal to activate a first single-bit DAC element and a second asserted bit of the noise-corrected control signal to activate a second single-bit DAC element, the first single-bit DAC element and the second single-bit DAC element being preselected to have respective errors that at least partially cancel; and means for summing DAC element outputs of the plurality of single-bit DAC elements to generate an analog output signal.

18. The DAC circuit of claim 17, the first single-bit DAC element having an error greater than an average error of the plurality of single-bit DAC elements and the second single-bit DAC element having an error less than the average error of the plurality of single-bit DAC elements.

19. The DAC circuit of claim 18, the error of the first single-bit DAC element and the second single-bit DAC element being at least one of a gain error or a timing error.

20. The DAC circuit of claim 17, the first single-bit DAC element having a highest error among the plurality of single-bit DAC elements and the single-bit DAC element having a lowest error among the plurality of single-bit DAC elements.

* * * * *